(12) United States Patent
Tebje et al.

(10) Patent No.: US 12,077,429 B2
(45) Date of Patent: Sep. 3, 2024

(54) MICROMECHANICAL SENSOR DEVICE AND CORRESPONDING PRODUCTION METHOD

(71) Applicant: Robert Bosch GmbH, Stuttgart (DE)

(72) Inventors: Lars Tebje, Reutlingen (DE); Jochen Reinmuth, Reutlingen (DE); Johannes Classen, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 259 days.

(21) Appl. No.: 17/421,330

(22) PCT Filed: Feb. 27, 2020

(86) PCT No.: PCT/EP2020/055145
§ 371 (c)(1),
(2) Date: Jul. 7, 2021

(87) PCT Pub. No.: WO2020/178135
PCT Pub. Date: Sep. 10, 2020

(65) Prior Publication Data
US 2022/0063990 A1 Mar. 3, 2022

(30) Foreign Application Priority Data
Mar. 1, 2019 (DE) .......................... 102019202794.6

(51) Int. Cl.
*B81B 7/02* (2006.01)
*B81C 1/00* (2006.01)
(Continued)

(52) U.S. Cl.
CPC ............ *B81B 7/02* (2013.01); *B81C 1/00341* (2013.01); *G01C 19/5783* (2013.01);
(Continued)

(58) Field of Classification Search
CPC .............................. B81B 7/02; G01L 19/0092
See application file for complete search history.

(56) References Cited

U.S. PATENT DOCUMENTS

| 2012/0256282 A1 | 10/2012 | Lin et al. |
| 2013/0340525 A1 | 12/2013 | Liu |

(Continued)

FOREIGN PATENT DOCUMENTS

| CN | 101334422 A | 12/2008 |
| CN | 104773705 A | 7/2015 |

(Continued)

OTHER PUBLICATIONS

International Search Report for PCT/EP2020/055145, issued Jun. 4, 2020.

*Primary Examiner* — David A Zarneke
(74) *Attorney, Agent, or Firm* — NORTON ROSE FULBRIGHT US LLP; Gerard A. Messina

(57) ABSTRACT

A micromechanical sensor device and a corresponding production method. The micromechanical sensor device has a substrate which has a front side and a rear side. Formed on the front side, at a lateral distance, are an inertial sensor region having an inertial structure for acquiring external accelerations and/or rotations, and a pressure sensor region having a diaphragm region for acquiring an external pressure. A micromechanical function layer by which the diaphragm region is formed in the pressure sensor region. A micromechanical function layer is applied on the micromechanical function layer, the inertial structure being formed out of the second and third micromechanical function layer. A cap device encloses a first predefined reference pressure in a first cavity in the inertial sensor region, and a second cavity is formed underneath the diaphragm region.

15 Claims, 16 Drawing Sheets

(51) Int. Cl.
    *G01C 19/5783*     (2012.01)
    *G01L 7/08*        (2006.01)
    *G01L 19/00*       (2006.01)
    *G01P 15/08*       (2006.01)
    *G01P 15/125*      (2006.01)

(52) U.S. Cl.
    CPC .......... *G01L 7/082* (2013.01); *G01L 19/0092* (2013.01); *G01P 15/0802* (2013.01); *G01P 15/125* (2013.01); *B81B 2201/0235* (2013.01); *B81B 2201/0242* (2013.01); *B81B 2201/0264* (2013.01); *B81B 2203/0127* (2013.01); *B81B 2203/04* (2013.01); *B81C 2201/0105* (2013.01); *B81C 2201/014* (2013.01)

(56) References Cited

U.S. PATENT DOCUMENTS

| | | |
|---|---|---|
| 2014/0008738 A1 | 1/2014 | Morris, III et al. |
| 2015/0035093 A1 | 2/2015 | Feyh et al. |
| 2016/0341616 A1 | 11/2016 | Classen |
| 2017/0336435 A1 | 11/2017 | Tseng et al. |

FOREIGN PATENT DOCUMENTS

| | | |
|---|---|---|
| CN | 106029555 A | 10/2016 |
| DE | 102006011545 A1 | 9/2007 |
| DE | 102013213065 A1 | 1/2015 |
| DE | 102014200507 A1 | 7/2015 |
| DE | 102017220349 B3 | 6/2018 |
| EP | 2871455 A1 | 5/2015 |
| WO | 2012122876 A1 | 9/2012 |

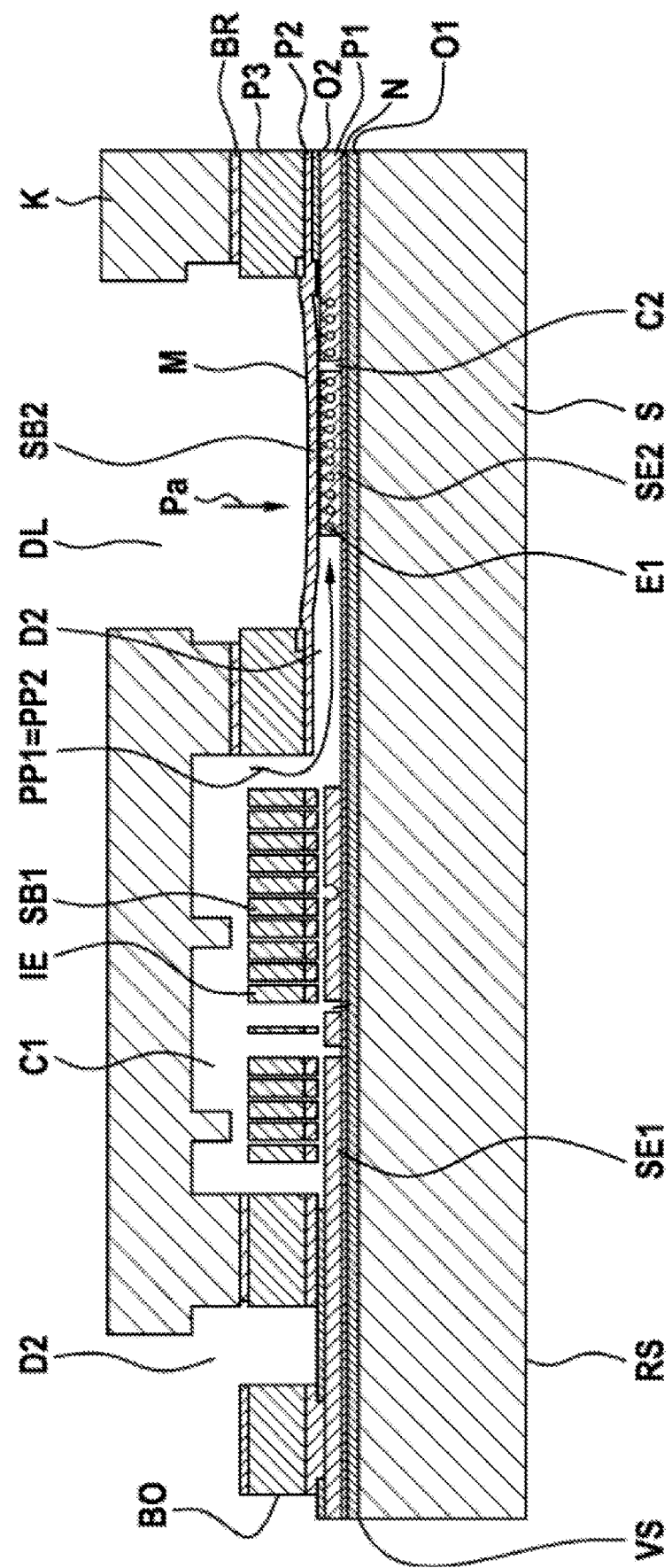

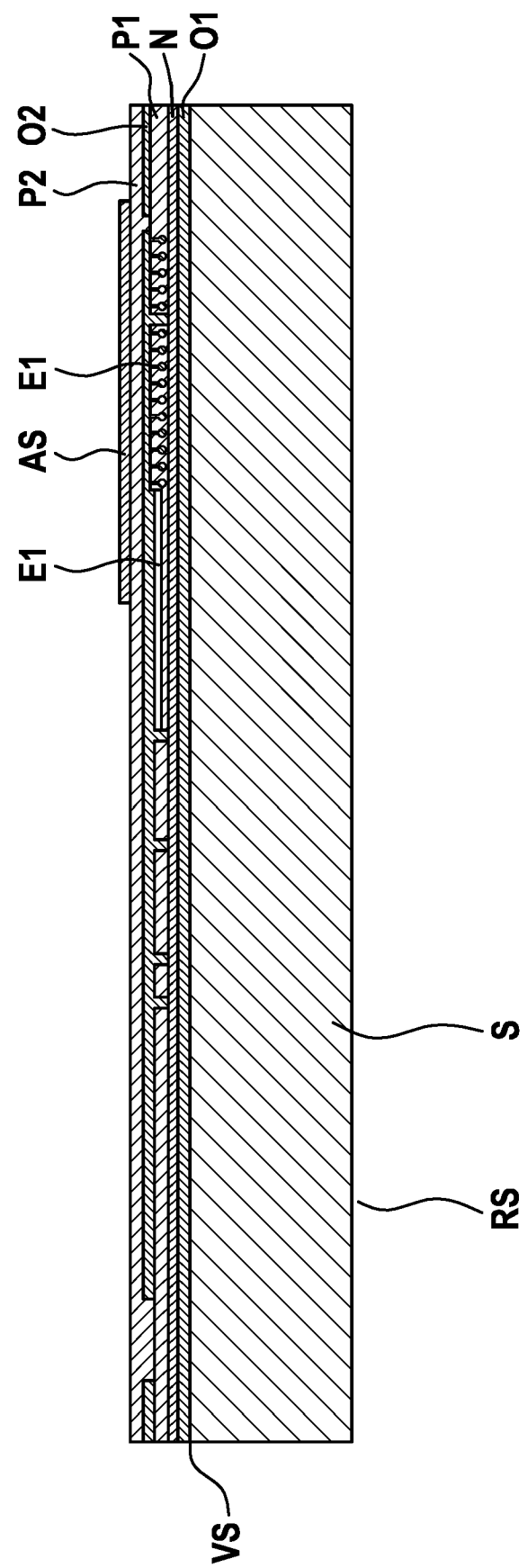

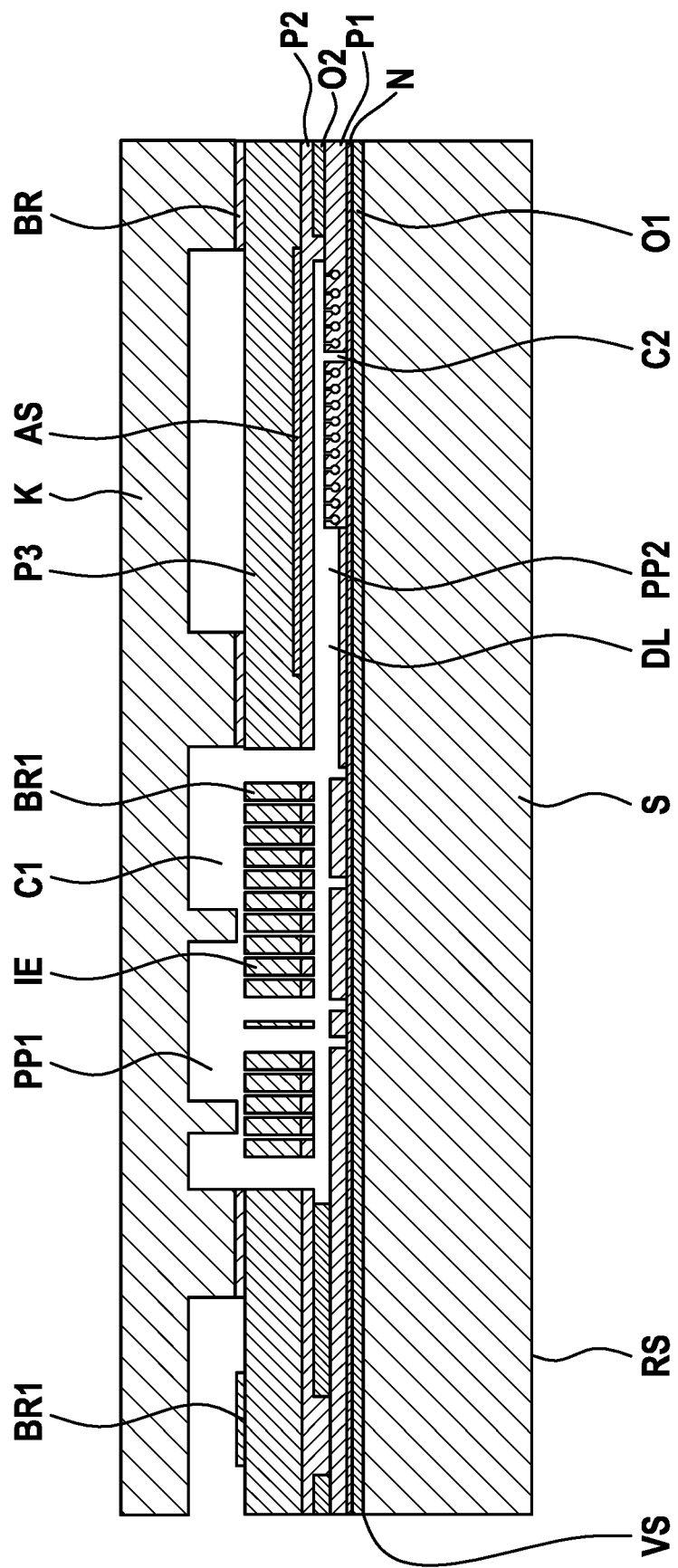

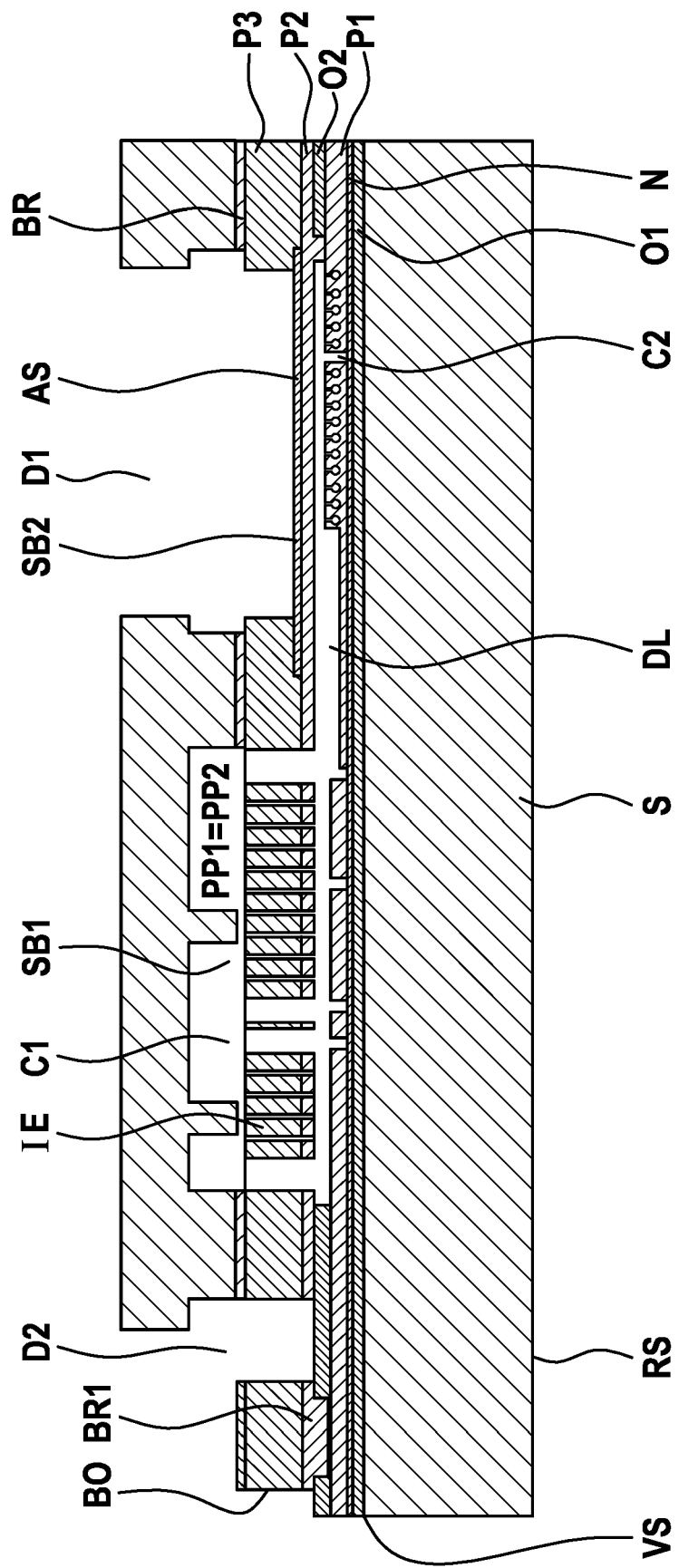

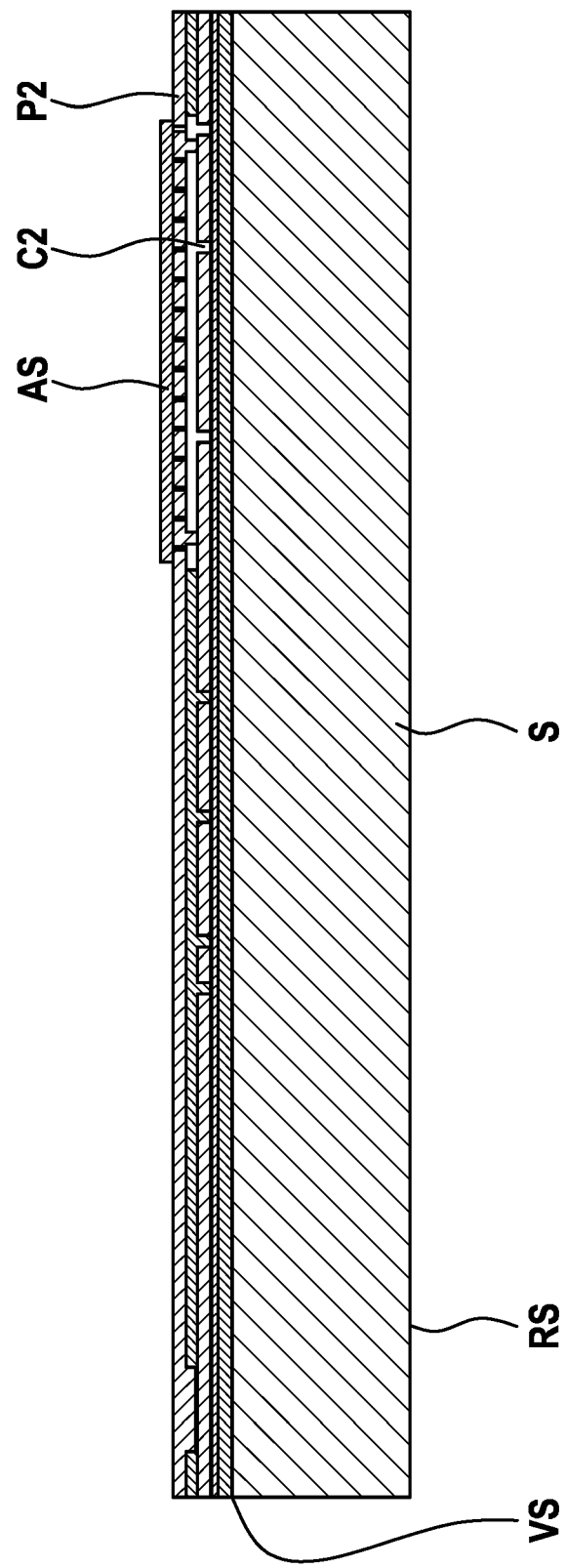

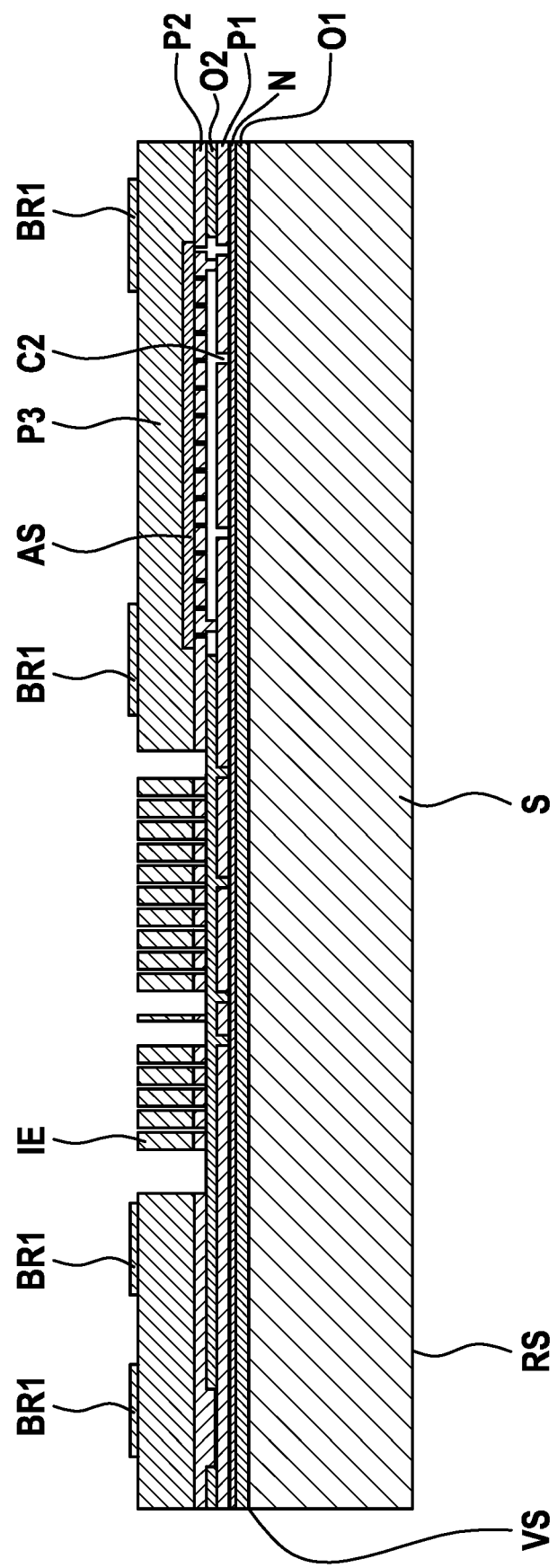

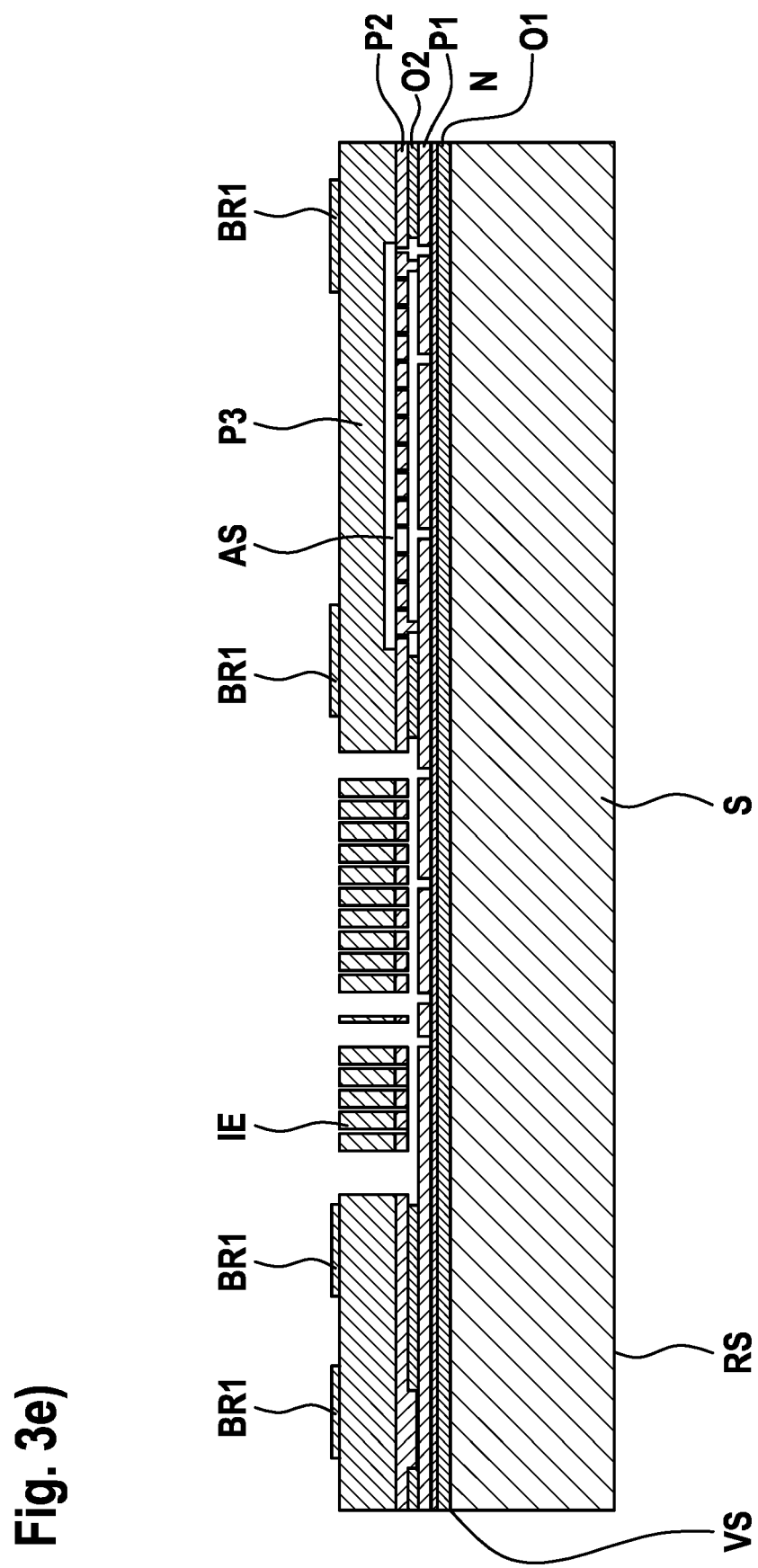

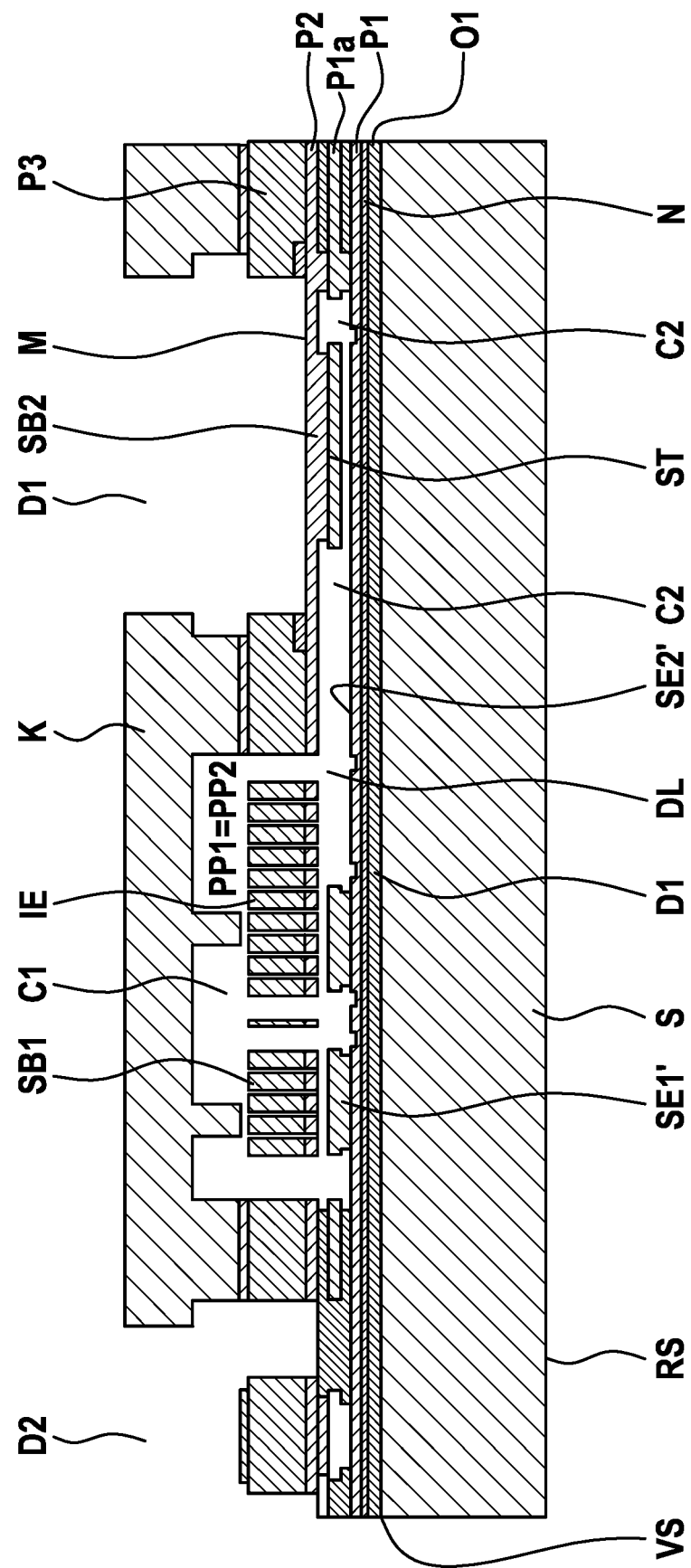
Fig. 4)

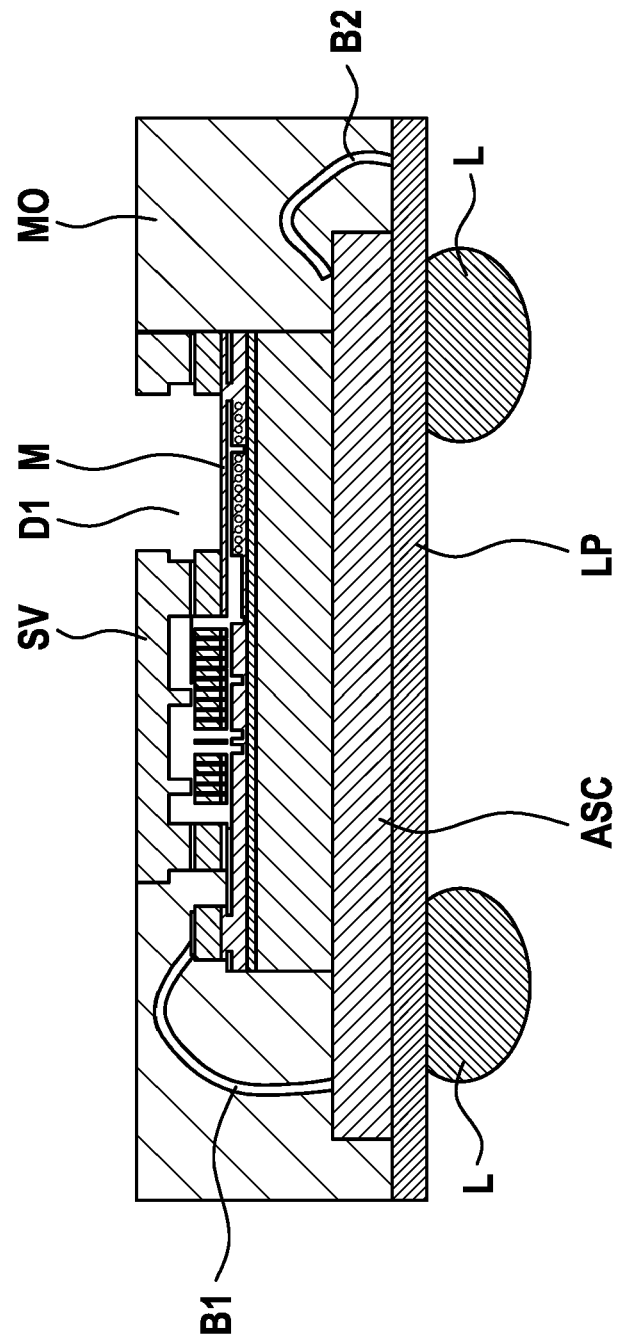
Fig. 5)

MICROMECHANICAL SENSOR DEVICE AND CORRESPONDING PRODUCTION METHOD

FIELD

The present invention relates to a micromechanical sensor device and to a corresponding production method.

BACKGROUND INFORMATION

Although any micromechanical components may be used, the present invention and the problems on which it is based are described with reference to components having inertial sensors based on silicon.

Micromechanical sensor devices for measuring accelerations, rates of rotation, magnetic fields and pressures, for instance, are generally conventional and are mass-produced for various applications in the automotive and consumer field. The miniaturization of the components, the function integration and an effective cost reduction, in particular, are trends in the consumer electrode.

Acceleration and rate-of-rotation sensors and also acceleration and magnetic field sensors are currently already produced as combination sensors (6 d), and there are also first 9 d modules in which three-axial acceleration, rate-of-rotation and magnetic field sensors are combined in a single sensor device.

In a few cases, micromechanical pressure sensor devices with micromechanical inertial sensor devices are already installed in a single housing, that is to say, often still on separate MEMS chips but sometimes also already integrated on one chip. Such proposals for the integration of inertial and pressure sensor devices are described by German Patent Application No. DE 10 2006 011 545 A1 and U.S. Patent Application Publication No. US 2012/0256282 A1, for example.

SUMMARY

The present invention provides a micromechanical sensor device and a corresponding production method.

Preferred further developments and example embodiments of the present invention are disclosed herein.

The micromechanical sensor device and the corresponding production method according to example embodiments of the present invention allow for a compact integration of a combined pressure and inertial sensor device in a moderate number of process steps. The production method according to an example embodiment of the present invention is particularly characterized by the use of a shared and uninterrupted trench process for producing the through opening as a media access and for backthinning the diaphragm region to a target thickness.

According to a preferred further refinement of the present invention, a connection channel for the fluidic connection of the first and the second cavity is formed in the first micromechanical function layer and/or the second micromechanical function layer, so that the first and second reference pressure are equal. This makes it possible to work with a common reference pressure and simplifies the production.

According to another preferred further refinement of the present invention, the cap device has a second through opening, which exposes a bond lead region, which is electrically connected to the first micromechanical function layer. This provides a simple opportunity for an electrical connection of the sensor device.

According to an additional preferred further refinement of the present invention, the bond lead is formed out of the second and third micromechanical function layer. This makes it possible to form the bond lead together with further functional components.

According to another preferred further refinement of the present invention, a fourth micromechanical function layer is formed between the first and the second micromechanical function layer, and a stamp-shaped, movable electrode region is developed out of the second and fourth micromechanical function layer on the underside of the diaphragm region. This increases the electrical sensitivity of the pressure sensor region.

According to an additional preferred further refinement of the present invention, at least in the first micromechanical function layer, stationary electrode regions are formed in the inertial sensor region and in the pressure sensor region. In this way, stationary electrode regions can be easily realized while saving space.

BRIEF DESCRIPTION OF THE DRAWINGS

Additional features and advantages of the present invention are described below based on embodiments with reference to the figures.

FIG. 4 shows a schematic cross-sectional view to describe a micromechanical sensor device according to a fourth embodiment of the present invention.

FIG. 5 shows a schematic cross-sectional view to describe an exemplary product packaging of a micromechanical sensor device according to the first to the fourth embodiment of the present invention.

DETAILED DESCRIPTION OF EXAMPLE EMBODIMENTS

Figure 1A:
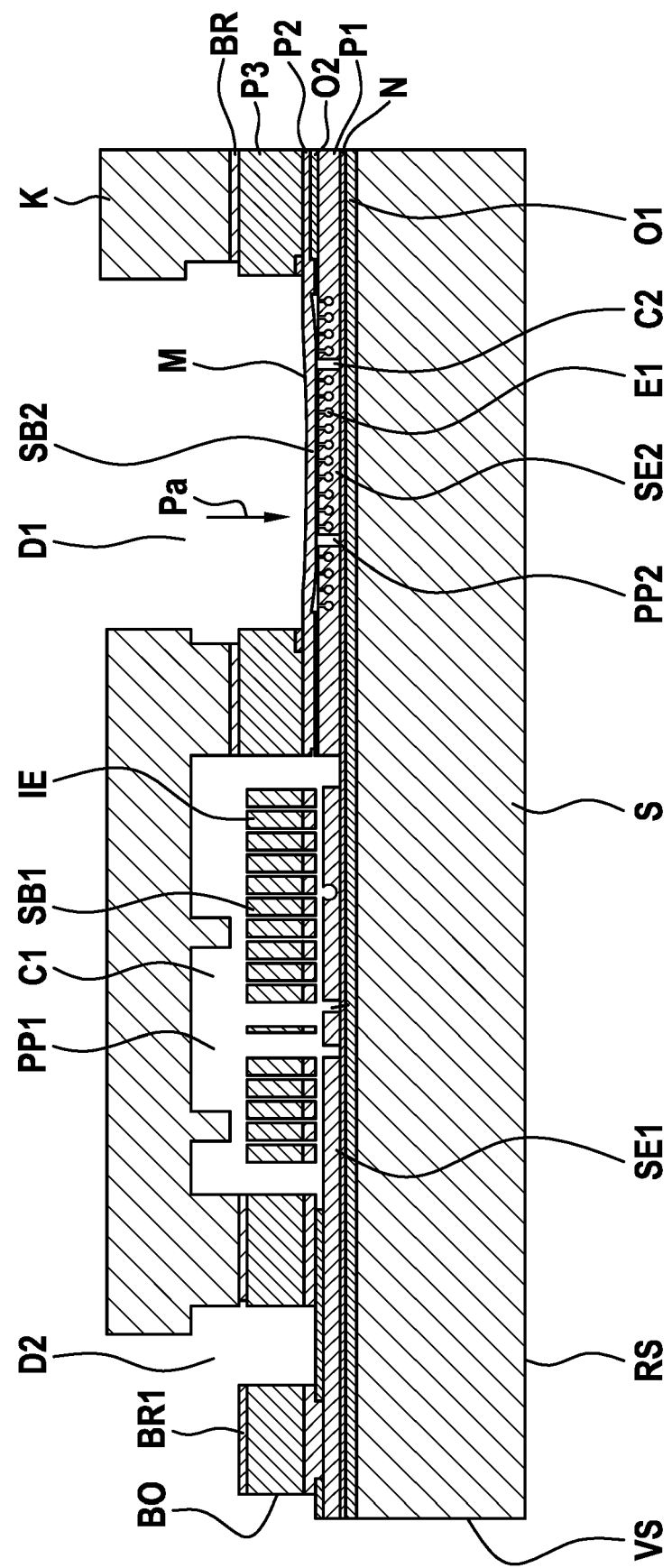
FIG. 1a), 1b) show schematic cross-sectional views to describe a micromechanical sensor device according to a first embodiment of the present invention, FIGS. 1a) and 1b) showing different vertical sectional planes.

Identical reference numerals in the figures describe identical or functionally equivalent elements.

FIG. 1a), b) are schematic cross-sectional views to describe a micromechanical sensor device according to a first embodiment of the present invention, FIGS. 1a) and 1b) showing different vertical sectional planes.

Reference numeral S in FIG. 1a), b) denotes a substrate such as a silicon wafer substrate, which has a front side VS and a rear side RS.

A first insulation layer O1, e.g. a silicon oxide layer, and a second insulation layer N, e.g., a silicon nitride layer, are applied to front side VS.

Formed on top on front side VS, at a lateral distance, is an inertial sensor region SB1 having an inertial structure IE for acquiring external accelerations, and a pressure sensor region SB2 having a diaphragm region M for acquiring an external pressure Pa.

In particular, a first micromechanical function layer P1 such as a polysilicon layer is applied on second insulation layer N. First micromechanical function layer P1 is structured in such a way that it has the respective stationary electrode regions SE1, SE2 in inertial sensor region SB1 and in pressure sensor region SB2. Furthermore, first micromechanical function layer P1 has first etch channels E1, which do not contribute to the function of the sensor device but play a role in its production in the present first embodiment, as will still be described in the following text. Such etch channels are described in German Patent Application No. DE 10 2013 213065 A1, for instance.

A second micromechanical function layer P2, e.g. also a polysilicon layer, for instance, is formed on first micromechanical function layer P1 and structured in pressure sensor region SB2 to form a diaphragm region M, which is set apart from first micromechanical function layer P1. Situated between the first and second micromechanical function layers P1, P2 is a third insulation layer O2, which is a silicon oxide layer, for instance. It serves as a sacrificial layer during the production process.

A third micromechanical function layer P3 is applied on second mechanical function layer P2. Inertial structure IS is formed out of second and third micromechanical function layer P2, P3 such as in the form of one or more comb electrode regions.

A cap device K, e.g., a silicon cap wafer, is bonded to third micromechanical function layer P3 with the aid of a bond frame BR. Cap device K encloses a first, predefined reference pressure PP1 in a first cavity C1 in inertial sensor region SB1 and has a first through opening D1 in pressure sensor region SB2 for the application of external pressure Pa to diaphragm region M.

In addition, a second cavity C2 in which a second, predefined reference pressure PP2 is enclosed, is formed underneath diaphragm region M.

Cap device K has a second through opening D2, which exposes a bond lead region BO, which is situated next to inertial sensor region SB1 and pressure sensor region SB2 and is electrically connected via second and third micromechanical function layer P2, P3 to first micromechanical function layer P1.

A bond contact region BR1, e.g., of aluminum, is applied on bond lead region BO.

FIG. 1b) shows the representation of FIG. 1a) in a different vertical sectional plane and illustrates that in the first embodiment, a connection channel DL for the fluidic connection of first and second cavity C1, C2 is formed in first and second micromechanical function layer P1, P2, so that first reference pressure PP1 and the second reference pressure PP2 are equal, that is to say, PP1=PP2.

During the sacrificial layer etching, connection channel DL furthermore is used for exposing diaphragm region M in order to route the etching means, e.g., gaseous HF gas, to third insulation layer O2 as a sacrificial layer underneath diaphragm region M.

Thus, it is possible to define reference pressure PP1=PP2 of the sensor device by the cavity pressure adjusted during the wafer bonding. In general, a very low reference pressure is particularly advantageous for a pressure sensor device as it is also required in the operation of an acceleration/yaw rate sensor.

As an alternative, it is possible to adjust the pressure in cavities C1, C2 not during the wafer bonding but via what is known as a laser reseal, in which an opening hole is produced in cap device K after the wafer bonding, the desired reference pressure is adjusted, and the opening hole is subsequently closed by a laser.

Figure 2A:
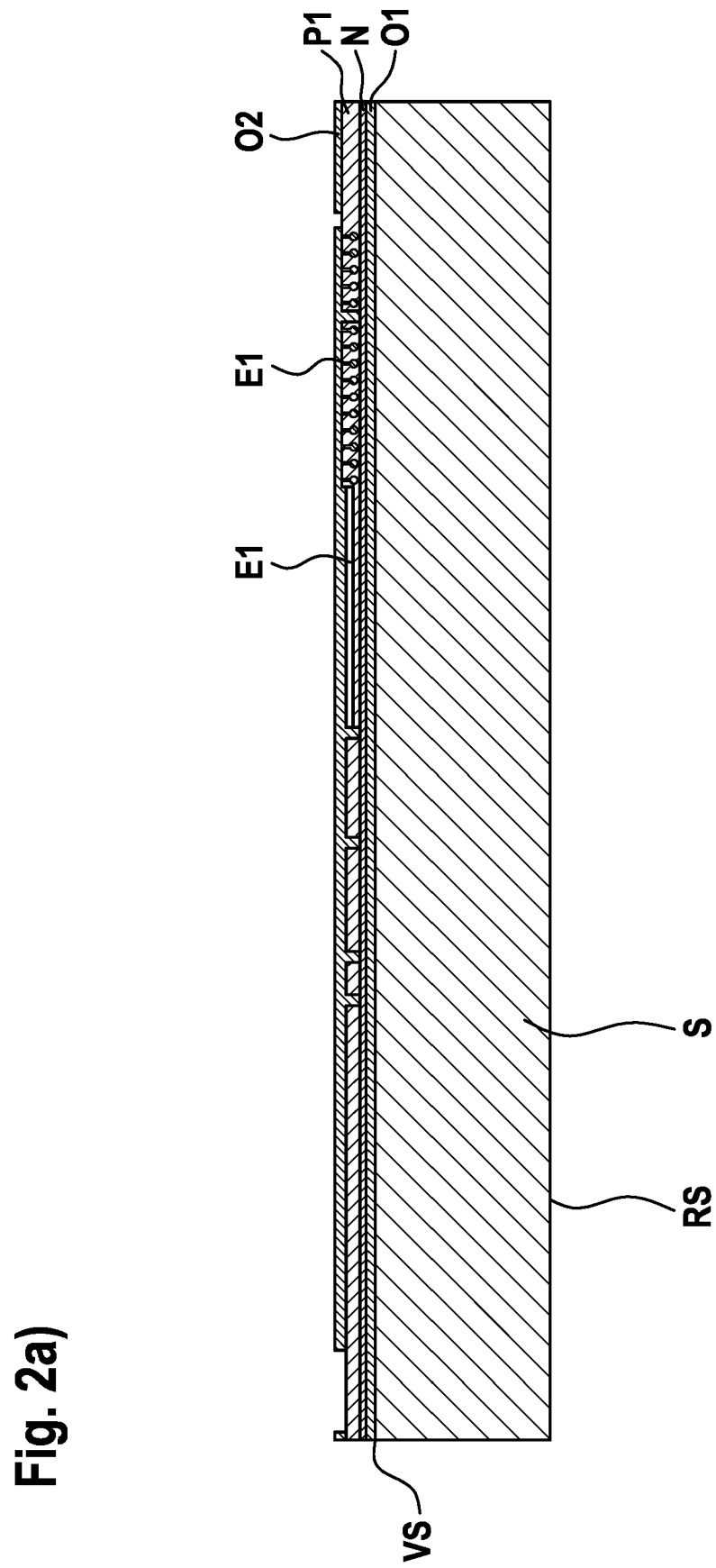
FIG. 2a)-f) show schematic cross-sectional views to describe a production method of the micromechanical sensor device according to FIG. 1a), b), according to a second embodiment of the present invention.

FIG. 2a)-f) are schematic cross-sectional views to describe a production method of the micromechanical sensor device according to FIG. 1a), b) according to a second embodiment of the present invention.

According to FIG. 2a), first insulation layer O1 of silicon oxide and second insulation layer N of silicon nitride are first deposited on front side VS of substrate S. Next, the deposition and structuring of first micromechanical function layer P1 of polysilicon takes place. The structuring is carried out in a two-stage etching process. To begin with, using DRIE (deep reaction ion etching), short trench etching for the opening of smaller vertical trenches is carried out and then a short, anisotropic etch step for creating etch channels E1 having essentially round cross-sectional profiles within the first micromechanical function layer P1, as described in detail in German Patent Application No. DE 10 2013 213 065 A1, for instance.

Next, third insulation layer O2 of silicon oxide is deposited and structured, which will be partially removed as a sacrificial layer in a later method step. When depositing third insulation layer O2, the small upper openings of etch channels E1 in first micromechanical function layer P1 are completely sealed. However, etch channels E1 are only partially filled and thus remain permeable in their longitudinal direction to etching gas, e.g., HF gas, for etching third insulation layer O2 as the sacrificial layer. In FIG. 2a), etch channels E1 which extend into the image plane and have a circular cross-section are shown as well as an etch channel which extends in parallel with the drawing plane from left to right.

Furthermore with reference to FIG. 2b), the deposition and structuring of second micromechanical function layer P2 as well as of an etch stop layer AS, also a silicon oxide layer, for instance, or alternatively a combined silicon oxide nitride layer, then take place. Etch stop layer AS is structured in such a way that it remains standing in a region above diaphragm layer M to be formed at a later point in time.

Figure 2C:
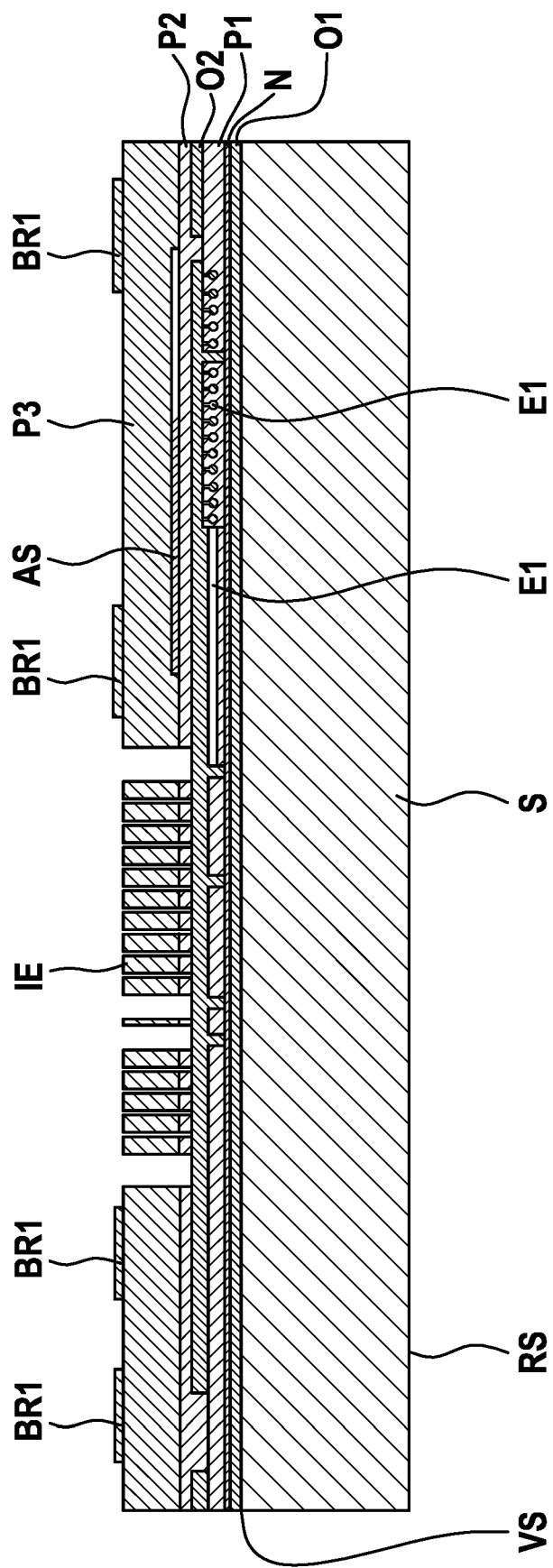

As shown in FIG. 2c), third micromechanical function layer P3 of polysilicon is subsequently deposited on second micromechanical function layer P2 and etch stop layer AS and structured. In this particular embodiment, the thickness of third micromechanical function layer P3 is considerably greater than the thickness of first and second micromechanical function layers P1, P2.

Next, bond contact regions BR1 of aluminum are deposited on third micromechanical function layer P3 and structured. Using trench etching, which stops on third insulation layer O2 or the sacrificial layer, inertial structure IE is then formed in inertial sensor region SB1. Third micromechanical function layer P3 is masked in the region of diaphragm region M to be formed at later time, and is therefore not etched yet. This is advantageous because the trench etching for inertial sensor region SB1 has to open very narrow trenches in inertial structure IE.

If third micromechanical function layer P3 in diaphragm region M were already removed in the same process step, then very narrow trenches would have to be opened simultaneously in inertial sensor region SB1 and large areas or trenches in pressure sensor region SB2. This is critical with regard to the homogeneity of the etching process because large areas or trenches are generally etched faster than narrow trenches (what is known as the ARDE effect or aspect ratio dependent etching). Since it is also still necessary to reliably open the narrow trenches on the entire surface, strong lateral etching may take place on the large open surfaces, which is typically is particularly pronounced at the boundary surface to etch stop layer AS. This effect is also known as notching. In this particular case, the notching could lead to less precisely defined lateral dimensions of diaphragm region M, and thus to sensitivity variances of the sensor elements on a substrate S or from substrate to substrate. In addition, given high over-etching, there would be the risk that the passivation would be strongly attacked by etch stop layer AS on second micromechanical function layer P2 or could possibly even be used up completely and an undesired etch attack would take place on the second micromechanical function layer in diaphragm region M.

Figure 2D:
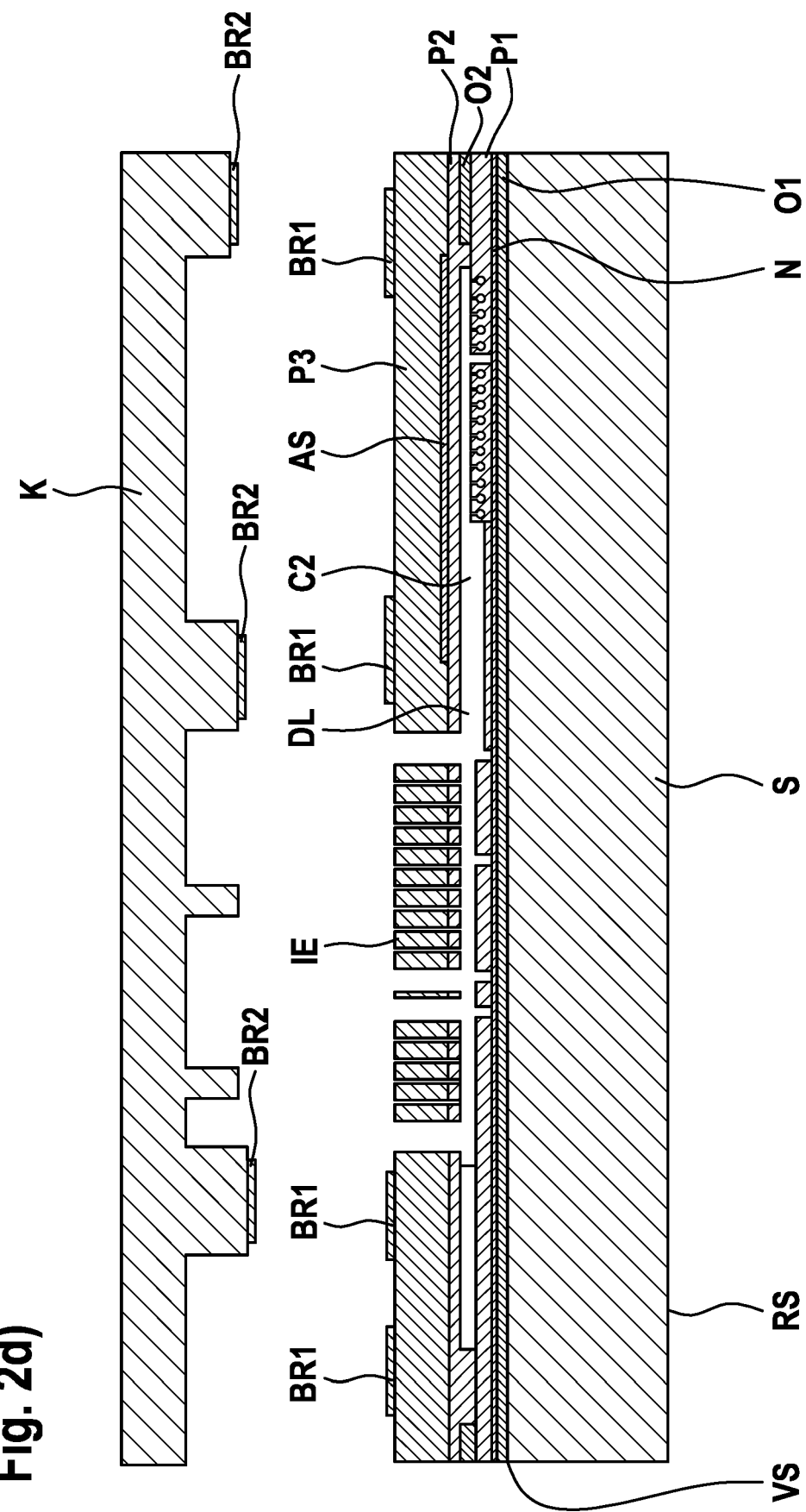

FIG. 2d) shows the state after the partial removal of sacrificial layer O2, which is preferably accomplished using HF gas that propagates via the interspaces of inertial structure IE in the sacrificial layer and in etch channels E1. In the process, sacrificial layer O2 is removed both in the region of inertial structure IS and in the region underneath diaphragm region M to be formed. Inertial structure IS is thereby exposed and movable. Diaphragm region M, on the other hand, is barely movable yet because the overall stiffness of second and third micromechanical function layers P2, P3 is extremely high.

Furthermore with reference to FIG. 2d), cap device K is provided such as in the form of a silicon cap wafer, for example. Bond contact regions BR2 on cap device K are realized as germanium regions, for instance, which are situated opposite the bond contact regions BR1 on third micromechanical function layer P3 which are to be connected thereto. This allows for eutectic bonding between bond contact regions BR1 of aluminum and bond contact regions BR2 of germanium in order to form bond frame BR.

It is of course also possible that bond contact regions BR1 are made of germanium and bond contact regions BR2 of aluminum.

Other bonding methods such as glass frit, other metallic bonding methods such as copper-tin, gold-silicon, etc., and direct bonding methods are alternatives as well.

FIG. 2e) shows the state after cap device K has been bonded to third micromechanical function layer P3 via bonding frame BR. Reference pressure PP1 in first cavity C1 of inertial senor region SB is equal to second reference pressure PP2 in second cavity C2 underneath diaphragm region M still to be completed.

In the present example, this common reference pressure PP1=PP2 is set directly during the bonding process. As already mentioned earlier, in this process stage it would also be possible to carry out a laser reseal process, for instance in order to set an even lower reference pressure or an especially homogeneous reference pressure on entire substrate S. However, this would require all cavities C1 of all components situated on substrate S to be opened.

As illustrated in FIG. 2f), a trench etch step on cap device K follows as the next process step. With the aid of this trench etch step, bond lead regions BO with bond frame regions BR1 situated thereon are simultaneously exposed by through opening D2, and through opening D1 for the media access of pressure sensor region SB2 is formed as well. In this etch step, third micromechanical function layer P3 is furthermore removed above etch stop region AS, etch stop region AS functioning as an etch stop for the trench etching process.

In an optional process step (not illustrated), etch stop region AS may be removed from diaphragm region M in addition. Because of the type and thickness of the remaining etch stop layer, the stress management of diaphragm region M may possibly be optimized, in particular with regard to a possible variation of the bending of diaphragm region M in a temperature change.

Figure 3A:
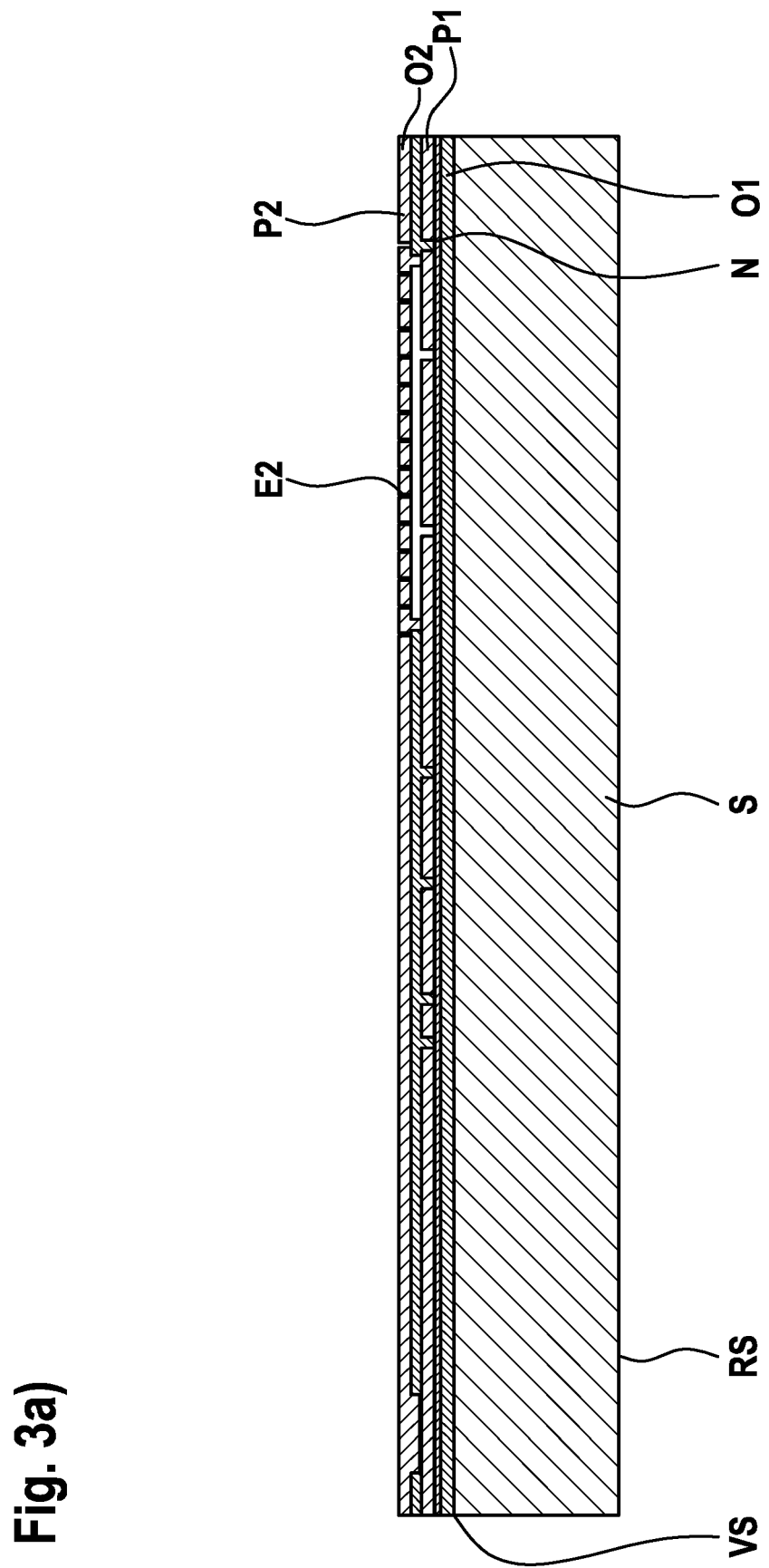
FIG. 3a)-f) show schematic cross-sectional views to describe a micromechanical sensor device and a corresponding production method according to a third embodiment of the present invention.

FIG. 3a)-f) are schematic cross-sectional views to describe a micromechanical sensor device and a corresponding production method according to a third embodiment of the present invention.

In the third embodiment, first micromechanical function layer P1 according to FIG. 3a) is not provided with etch trenches but trenched only in those locations where electrode regions are to be created. Second micromechanical function layer P2 is structured with fine etch trenches E2 in the diaphragm region to be formed.

Figure 3B:
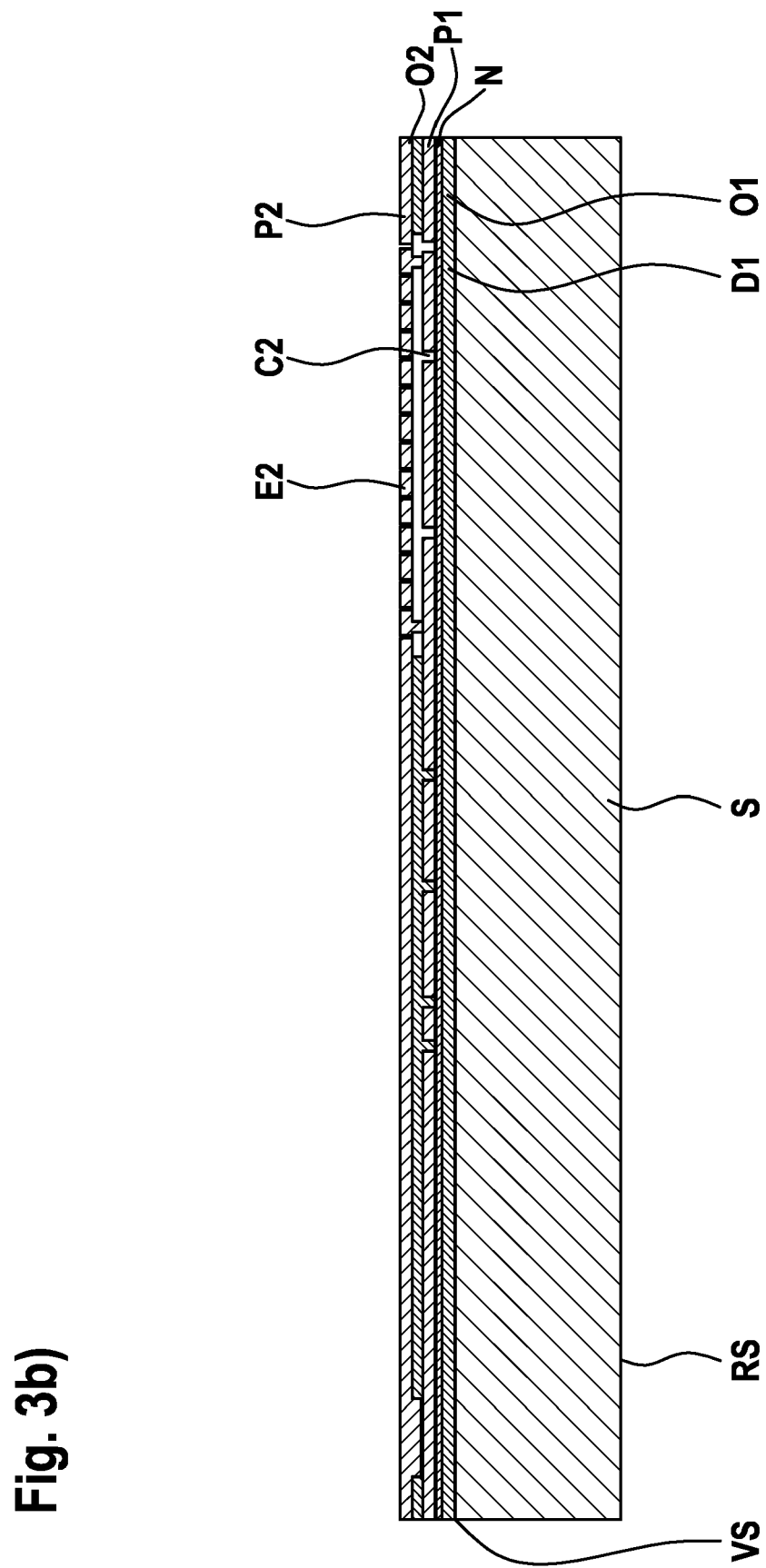
Figure 3F:
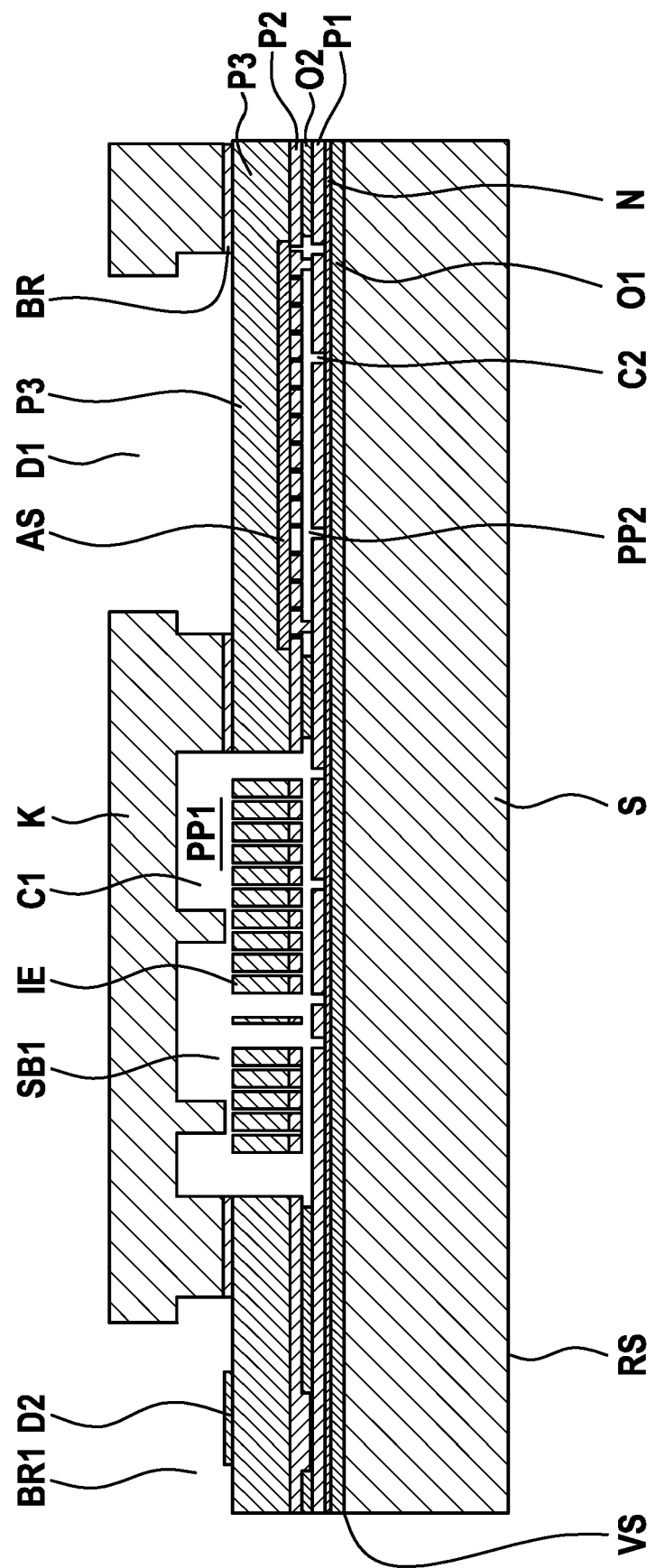

Next, with reference to FIG. 3b), a first sacrificial etch step takes place in which diaphragm region M to be formed is exposed by removing third insulation layer O2 situated underneath as the sacrificial layer. The fine trench openings of etch trenches E2 in diaphragm region M are then sealed in diaphragm region M via an etch stop layer, similar to the first embodiment, etch stop region AS, as shown in FIG. 3c), being left once again in diaphragm region M to be formed.

FIG. 3d) shows the state after the deposition and structuring of third micromechanical function layer P3 and the deposition and structuring of bond contact regions BR1 of aluminum.

According to FIG. 3e), inertial structure IE is also exposed in a further sacrificial etch step by removing third insulation layer O2 situated underneath. Next, as already described in connection with the previous embodiment, cap device K is provided for the bonding, and the shared trench etch step is subsequently carried out in order to expose bond connection region BO and to form through openings D1, D2.

In this particular embodiment, second reference pressure PP2 in second cavity C2 is not defined by the bonding step of cap device K in which first reference pressure PP1 is set in first cavity C2, but by the step in which etch channels E2 are sealed by etch stop region AS. Accordingly, reference pressures PP1 and PP2 may be adjusted differently.

As an alternative, it would of course also be possible to provide a connection channel for equalizing reference pressures PP1, PP2 in this embodiment as well.

FIG. 4 is a schematic cross-sectional view to describe a micromechanical sensor device according to a fourth embodiment of the present invention.

In the fourth embodiment, in contrast to the previously described embodiments, a fourth micromechanical function layer P1a, for instance of polysilicon, is formed between first and second micromechanical function layer P1, P2. In the fourth embodiment, diaphragm region M is stiffened in the central region in that a stamp-shaped movable electrode region ST is formed out of second and fourth micromechanical function layer P2, P1A on the underside of diaphragm region M. In the event of pressure changes, electrode region ST is therefore able to be moved, essentially like a plan-parallel plate, in the direction of stationary electrode SE2' of first micromechanical function layer P1 situated underneath. This allows for an especially high electrical sensitivity of pressure sensor region SB2 of the sensor device.

Stationary electrode SE1' of inertial sensor region SB1 is also produced out of first and fourth micromechanical function layer P1, P4.

It is advantageous that the useful gap in this embodiment is able to be defined by the thickness of the sacrificial layer between the first and second micromechanical function layer P1, P2, that is to say, independently of the useful gap of inertial sensor region SB, which is defined by the distance between micromechanical function layers P2 and P3 and/or P3 and P1A. Thus, it is possible in a particularly effective manner to separately optimize the mechanical and electrical properties of pressure sensor region SB2 and of the inertial sensor region.

FIG. 5 is a schematic cross-sectional view to describe an exemplary product packaging of a micromechanical sensor device according to the first to the fourth embodiment of the present invention.

According to the example of FIG. 5, sensor device SV, which represents one of the previously described sensor devices, is situated on an ASIC chip ASC and electrically connected therewith by way of wire bonds B1. The external electrical contacts of ASIC chip ASC are routed onto a support plate substrate LP via wire bonds B2. Next, the system is subjected to a molding process in order to produce a mold packaging MO, the chips being encapsulated by molding mass MO on the side, while the topside of sensor device SV remains free for the media access, in particular in the region of the first through opening for the pressure sensor region. If required, gelating of diaphragm region M (not illustrated) in the region of first through opening D1 may also take place in order to improve the media and moisture robustness of the sensor device. The product packaging can be realized either as an LGA (land grid array) or, as illustrated in FIG. 5), as a BGA (ball grid array) having solder regions L.

Although the present invention has been described based on preferred exemplary embodiments, it is not restricted thereto. In particular, the mentioned materials and topologies are merely of an exemplary nature and not restricted to the described examples.

What is claimed is:

1. A micromechanical sensor device, comprising:
a substrate which has a front side and a rear side;
an inertial sensor region including an inertial structure configured to acquire external accelerations and/or rotations and a pressure sensor region having a diaphragm region configured to acquire an external pressure, formed on the front side, at a lateral distance;
a first micromechanical function layer applied on the front side;
a second micromechanical function layer applied on the first micromechanical function layer, by which the diaphragm region is formed in the pressure sensor region, which is set apart from the first micromechanical function layer;
a third micromechanical function layer applied on the second micromechanical function layer, the inertial structure being formed out of the second and/or third micromechanical function layer; and
a cap device which is bonded to the third micromechanical function layer and encloses in the inertial sensor region a first predefined reference pressure in a first cavity and which has a first through opening in the pressure sensor region for application of the external pressure to the diaphragm region;
wherein a second cavity formed underneath the diaphragm region in which a second, predefined reference pressure is enclosed.

2. The micromechanical sensor device as recited in claim 1, wherein a connection channel for a fluidic connection of the first and second cavity is formed in the first micromechanical function layer and/or the second micromechanical function layer, so that the first and second reference pressures are equal.

3. The micromechanical sensor device as recited in claim 1, wherein the cap device has a second through opening, which exposes a bond lead region, which is electrically connected to the first micromechanical function layer.

4. The micromechanical sensor device as recited in claim 3, wherein the bond lead region is formed out of the second and third micromechanical function layer.

5. The micromechanical sensor device as recited in claim 1, wherein a fourth micromechanical function layer is formed between the first and the second micromechanical function layer, and a stamp-shaped, movable electrode region is developed out of the second and fourth micromechanical function layer on an underside of the diaphragm region.

6. The micromechanical sensor device as recited in claim 1, wherein at least in the first micromechanical function layer, respective stationary electrode regions are formed in the inertial sensor region and in the pressure sensor region.

7. A method for producing a micromechanical sensor device, comprising the following steps:
providing a substrate which has a front side and a rear side, an inertial sensor region having an inertial structure configured to acquire external accelerations and/or rotations and a pressure sensor region having a diaphragm region configured to acquire an external pressure, being formed on the front side, at a lateral distance;
applying and structuring a first micromechanical function layer on the front side;
applying and structuring a sacrificial layer on the first micromechanical function layer;
applying a second micromechanical function layer on the structured sacrificial layer;
forming an etch stop region on the second micromechanical function layer in an area of the diaphragm region to be formed;
applying a third micromechanical function layer on the second micromechanical function layer and the etch stop region;
structuring the second and/or third micromechanical function layer so that the inertial structure is formed in the inertial sensor region;
partially removing the sacrificial layer to expose an underside of the inertial structure and an underside of the diaphragm region to be formed;
bonding a cap device to the third micromechanical function layer, which encloses in the inertial sensor region a first predefined reference pressure in a first cavity;
forming a first through opening in the cap device in the pressure sensor region for application of the external pressure to the diaphragm region, and removing the third micromechanical function layer in the pressure sensor region in a trench etching process which stops on the etch stop region, whereby the diaphragm region is formed in the pressure sensor region;
wherein a second cavity, in which a second, predefined reference pressure is enclosed, is formed underneath the diaphragm region.

8. The method as recited in claim 7, wherein a connection channel for a fluidic connection of the first and the second cavity is formed in the first micromechanical function layer and/or in the second micromechanical function layer, so that the first and the second reference pressure are equal.

9. The method as recited in claim 7, wherein the sacrificial layer is removed in a single step in order to expose the underside of the inertial structure and the underside of the diaphragm region to be formed, via the inertial structure and via first etch channels formed in the first micromechanical function layer.

10. The method as recited in claim 7, wherein the sacrificial layer is removed in two steps in order to expose the underside of the inertial structure and the underside of the diaphragm region to be formed, and in a first step, prior to forming the etch stop region, the sacrificial layer is removed on the underside of the diaphragm region to be formed via etch channels developed in the second micromechanical function layer, and in a second step, the sacrificial layer is removed via the inertial structure in order to expose the underside of the inertial structure.

11. The method as recited in claim 7, wherein a second through opening is formed in the cap device, which exposes a bond lead region which is electrically connected to the first micromechanical function layer.

12. The method as recited in claim 11, wherein a bond lead in the bond lead region is formed out of the second and third micromechanical function layer.

13. The method as recited in claim 7, wherein a fourth micromechanical function layer is formed between the first and the second micromechanical function layer, and a stamp-shaped, movable electrode region is formed out of the second and fourth micromechanical function layer on the underside of the diaphragm region.

14. The method as recited in claim 7, wherein at least in the first micromechanical function layer, stationary electrode regions are formed in the inertial sensor region and in the pressure sensor region.

15. The method as recited in claim 7, wherein the etch stop layer is removed from the diaphragm region.

* * * * *